(12) United States Patent
Pawashe et al.

(10) Patent No.: US 11,195,719 B2
(45) Date of Patent: Dec. 7, 2021

(54) REDUCING IN-PLANE DISTORTION FROM WAFER TO WAFER BONDING USING A DUMMY WAFER

(71) Applicant: Intel Corporation, Santa Clara, CA (US)

(72) Inventors: Chytra Pawashe, Beaverton, OR (US); Daniel Pantuso, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 736 days.

(21) Appl. No.: 15/943,551

(22) Filed: Apr. 2, 2018

(65) Prior Publication Data
US 2019/0304784 A1    Oct. 3, 2019

(51) Int. Cl.
*H01L 21/18*    (2006.01)
*H01L 21/20*    (2006.01)

(52) U.S. Cl.
CPC ........ *H01L 21/187* (2013.01); *H01L 21/2007* (2013.01)

(58) Field of Classification Search
CPC ............... H01L 21/187; H01L 21/2007
See application file for complete search history.

(56) References Cited

U.S. PATENT DOCUMENTS

2010/0006972 A1\*    1/2010    La Tulipe, Jr. ......... H01L 24/94
257/499

\* cited by examiner

*Primary Examiner* — Karen Kusumakar
*Assistant Examiner* — Adam S Bowen
(74) *Attorney, Agent, or Firm* — Schwabe, Williamson & Wyatt P.C.

(57) ABSTRACT

Embodiments of the present disclosure describe techniques for reducing in-plane distortion from wafer to wafer bonding using a dummy wafer. One embodiment is an apparatus formed using a dummy wafer, the apparatus comprising: a device layer fusion bonded to a first side of a carrier wafer, wherein the dummy wafer comprises a first wafer and the carrier wafer comprises a second wafer that is different than the first wafer; wherein the device layer comprise a portion of a third wafer that is different than the second wafer; and wherein a second opposite side of the carrier wafer includes: a removal process artifact, wherein a distortion signature present in the portion of the second wafer is indicative of the use of the dummy wafer fusion bonded to the second side of the carrier wafer, or a remainder of the dummy wafer. Other embodiments may be disclosed and/or claimed.

15 Claims, 5 Drawing Sheets

REDUCING IN-PLANE DISTORTION FROM WAFER TO WAFER BONDING USING A DUMMY WAFER

TECHNICAL FIELD

The present disclosure relates to the field of wafer to wafer bonding. More specifically, the present disclosure is related to reducing in-plane distortion from wafer to wafer bonding using a dummy wafer.

BACKGROUND

In some wafer to wafer bonding (e.g., fusion bonding), two wafers may be brought into close proximity to one another (e.g., with surfaces thereof about 30 to a few hundred microns apart) and bonding may be initiated by locally deforming one or both of the wafers to make local contact between the wafers (e.g., without an adhesive). The wafers then bond to one another via propagation of the local contact to full bonding of the wafers. In particular, the wafers may remain attached due to interfacial surface adhesion (e.g., a van der Waals bond). Such techniques may provide undesirable distortions in one or both of the wafers and/or undesirable stress between the wafers.

DETAILED DESCRIPTION

Figure 1:
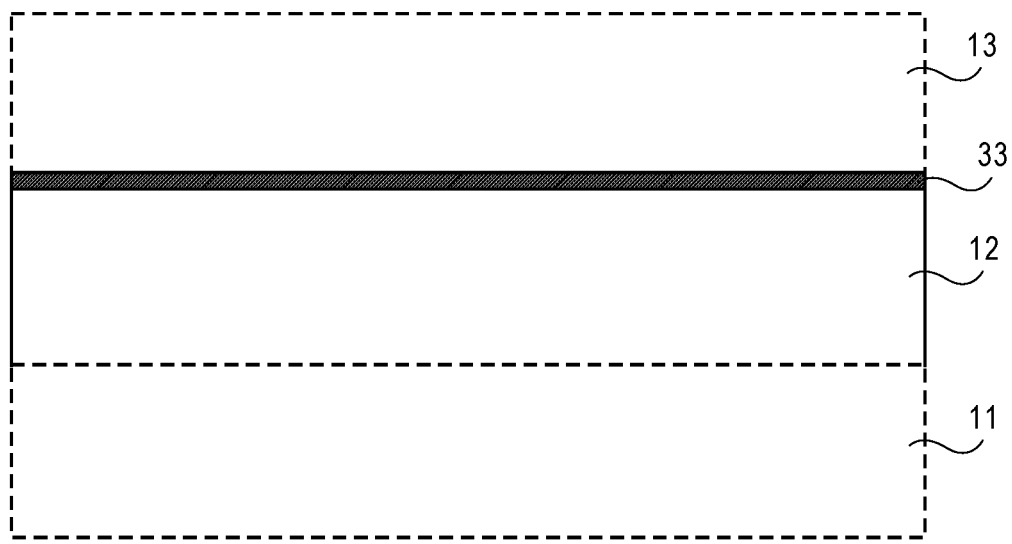
FIG. 1 is an illustration of an apparatus with reduced in-plane distortion (from wafer to wafer bonding) based on the use of a dummy wafer, according to various embodiments.

Described herein are systems and methods of reducing in-plane distortion from wafer to wafer bonding using a dummy wafer (e.g., one or more dummy wafers). In the following description, various aspects of the illustrative implementations will be described using terms commonly employed by those skilled in the art to convey the substance of their work to others skilled in the art. However, it will be apparent to those skilled in the art that the embodiments described herein may be practiced with only some of the described aspects. For purposes of explanation, specific numbers, materials and configurations are set forth in order to provide a thorough understanding of the illustrative implementations. However, it will be apparent to one skilled in the art that the described embodiments may be practiced without the specific details. In other instances, well-known features are omitted or simplified in order not to obscure the illustrative implementations.

Various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosed embodiments may form a device layer, e.g., a substrate, such as a semiconductor substrate. Thereafter structures and/or processes may be formed or carried out, respectively, on the substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosed embodiments, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosed embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and oxygen-containing metal alloys such as conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbon-containing metal alloys such as metal carbides of these metals, for example hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosed embodiments, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosed embodiments, a pair of sidewall spacers may be formed on opposing sides of the gate stack that bracket the gate stack. The sidewall spacers may be formed from materials such as silicon, nitrogen, carbon, and oxygen, for example silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. The dielectric materials may include elements such as silicon, oxygen, carbon, nitrogen, fluorine, and hydrogen. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Some wafer bonding processes (e.g., for manufacturing silicon-on-insulator wafers) may result in large IPD (in plane distortions) residuals. An IPD residuals may add alignment difficulty in subsequent patterning steps. Some wafer bonding processes may include adjusting tool settings in the wafer bonding equipment (such as: striker force, striker velocity, wafer gap, or vacuum chucking conditions) to attempt to reduce IPD.

Some embodiment disclosed herein utilize one or more dummy wafers in the bonding process to compensate and reduce the IPD in the target wafer. The dummy wafer may effectively gain an IPD that is the inverse of the IPD of the target wafer, and act to reduce its overall IPD.

Simulation analysis of a simple three wafer case indicates that distortions may be reduced by 2× or more. In addition, any reductions obtained with the multiple wafer proposed here will be added to any improvement based on tool setting changes (e.g., 2× further reduction from any reduction associated with tool setting changes).

In some bonding processes, one wafer of a pair of wafers may be held flat on a chuck. The other wafer of the pair may be pushed in the center with a striker. The force imparted by the striker may result in adhesion at the interface and a stress wave to propagate radially effectively "zipping" the wafers and bonding them. The distortions and in-plane deformations generated by the stress wave may be transferred to both wafers of the pair. In particular, the wafers may end up with distortions that are opposite and equal in magnitude (the wafer contacted with the striker may receive a distortion associated stretch applied by the striker, and the other wafer receive an opposite distortion, e.g., a distortion associated with a compression when the wafer contact with the striker is allowed to relax after the stretch from the striker).

In some embodiments, one or more dummy wafers may be bonded to a target wafer to impart a selected distortion signature on the wafer. When an additional wafer is then bonded to the wafer arrangement (e.g., bonded to the target wafer) producing additional distortion, all distortions may be superimposed effectively resulting in small distortions for a selected. The target wafer (e.g., a wafer between a dummy wafer and the additional wafer in some embodiments) may include a distortion having a magnitude that is less than a magnitude of the distortion signature.

FIG. 1 is an illustration of an apparatus 100 with reduced in-plane distortion (from wafer to wafer bonding) based on the use of a dummy wafer, according to various embodiments. The apparatus 100 may be formed using a first wafer 11 (e.g., the dummy wafer), a second wafer 12 (e.g., to provide a carrier wafer for the device layer 33), and a third wafer 13 (which may be partially removed (e.g., ground) following bonding to form the device layer 33, in some embodiments, or fully removed in other embodiments (the device layer 33 may have been provided on the second wafer 12 prior to bonding and the third wafer 13 may be removed completely). The dashed lines indicate that the apparatus 100 may include only a carrier wafer and the device layer 33 corresponding to the second wafer 12 and the third wafer 13, respectively. The first wafer 11 and the third wafer 13 may be removed during formation of the apparatus 100 for instance by a grinding process (the first wafer 11 may be partially or fully removed and the third wafer 13 may be fully or partially removed).

In other embodiments, formation of an apparatus similar to apparatus 100 may include providing a target wafer and one or more dummy wafers (e.g., a pair of wafers including the target wafer and a single dummy wafer, in some embodiments). A plural wafer arrangement may be formed by bonding the target wafer and the one or more dummy wafers. An additional wafer may be bonded to the plural wafer arrangement, and a device layer may be formed from the additional wafer.

Figure 2:
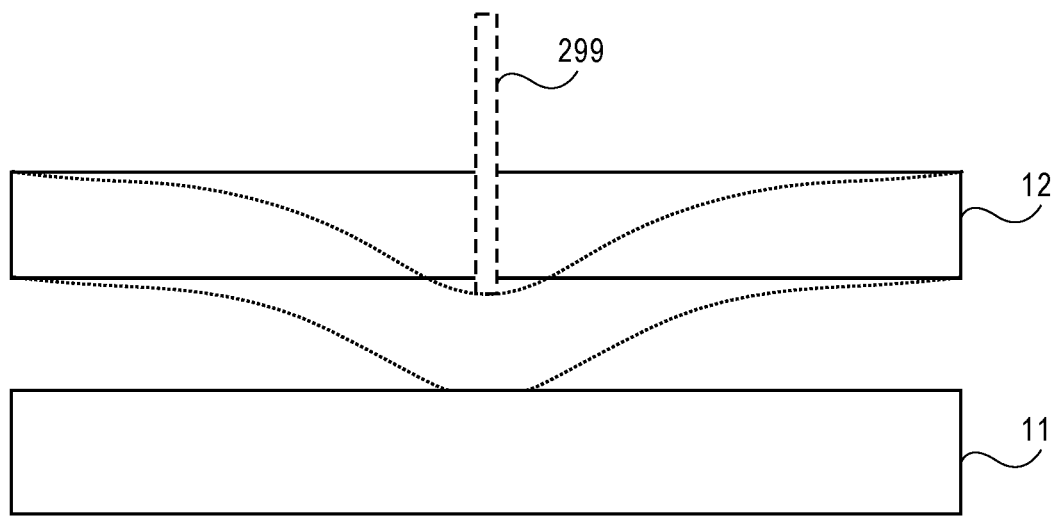
FIG. 2 is an illustration of local deformation of a wafer when bonding the wafer to a dummy wafer, according to various embodiments.

Referring again to apparatus 100, a first wafer 11 and a second wafer 12 are bonded, e.g., direct bonded (also referred to as fusion bonded) using any known bonding process. For instance, the first wafer 11 may be held on a chuck (not shown) and a striker (not shown) may make contact with the second wafer 12, which may ultimately cause the first wafer 11 to receive a first distortion that is opposite and equal in magnitude to a second distortion imparted to the second wafer 12 by the striker. The second distortion may be imparted at a time of contact of the striker with the second wafer 12 (during stretching of the second wafer 12 by the striker). FIG. 2 is an illustration of local deformation (e.g., stretching) of the second wafer 12 when bonding the second wafer 12 to a dummy wafer (e.g., first wafer 11), according to various embodiments. The contacting side of the first wafer 11 and/or the second wafer 12 may include a passivation layer (not shown), such as a buried oxide (BOX) layer, a layer of silicon nitride, or the like, or combinations thereof.

Referring again to FIG. 1, when the plural wafer arrangement is allowed to relax (not shown), and the first distortion may be associated with compression of the first wafer 11 based on the second distortion. Relaxation may include a reduction in magnitude of the second distortion (and the reduced second distortion may be equal and opposite to the first distortion).

The third wafer 13 may be bonded to the plural wafer arrangement (here, to the second wafer 12) using a similar bonding process. For instance, the plural wafer arrangement may remain on the chuck (e.g., the first wafer 11 may remain on the chuck, with a first side of the second wafer 12 bonded to the first wafer 11) or the plural wafer arrangement could have been removed from a bonder, annealed, and bought back into the bonder. The third wafer 13 may be moved into close proximity to the second opposite side of the second wafer 12, and contact may be made onto the third wafer 13 with the striker. This may impart a third distortion (due to stretching) at a time of the contact. When the plural wafer arrangement including the third wafer 13 is allowed to relax, the third wafer 13 may impart compression on the second wafer 12, which may be opposite to the reduced second distortion on the second wafer 12. This may further reduce the second distortion on the second wafer 12.

Thereafter, the first wafer 11 (e.g., the dummy wafer) may be removed (e.g., completely removed by grinding), and the third wafer 13 may be removed (e.g., partially or fully removed by grinding to provide the device layer 33). While some distortion may remain in the device layer 33, it may be significantly less than distortion of device layers of some other bonding processes.

Figure 3:
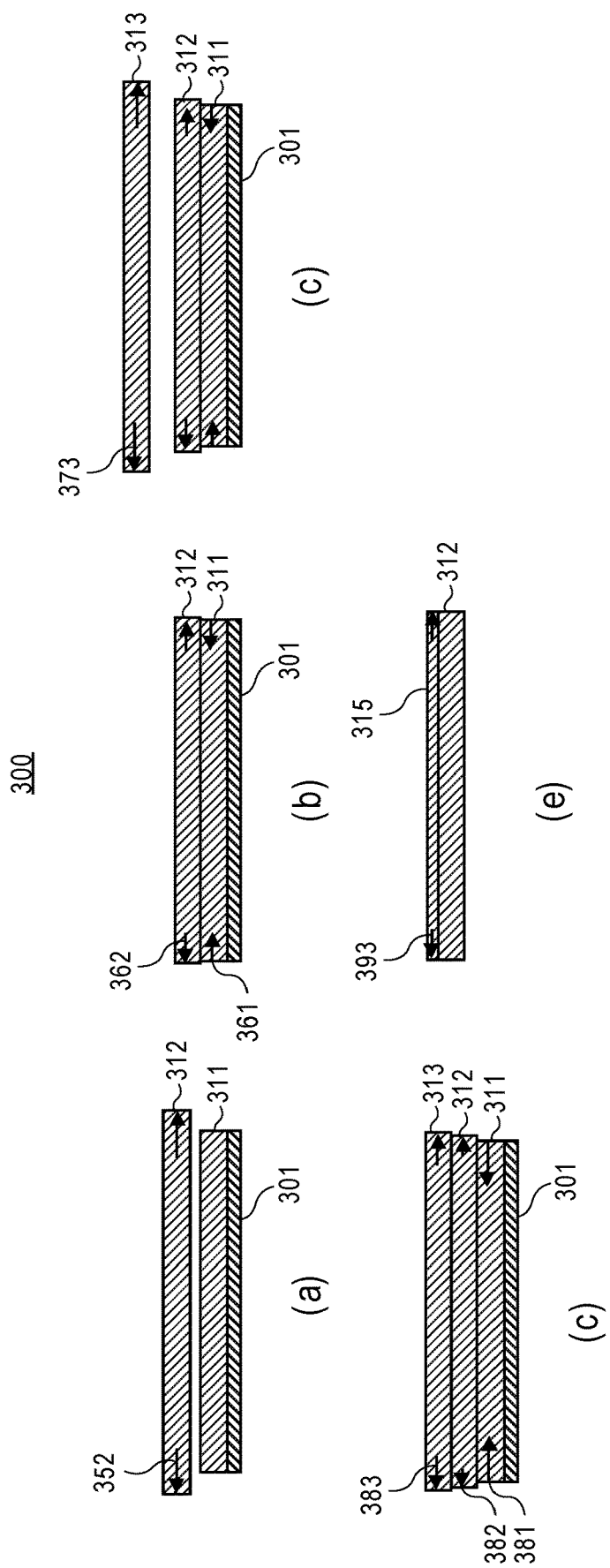
FIG. 3 is an illustration of a process of reducing in-plane distortion (from wafer to wafer bonding) based on the use of a dummy wafer, according to various embodiments.

FIG. 3 is an illustration of a process 300 of reducing in-plane distortion (from wafer to wafer bonding) based on the use of a dummy wafer 311, according to various embodiments. In operation (a), the dummy wafer 311 is placed on the chuck 301 (e.g., a bottom side of the dummy wafer 311 is held flat by the chuck 301). In some embodiments, dummy wafer 311 may be allowed to slide in the wafer's in-plane direction.

A wafer 312 is brought into close proximity to the dummy wafer 311, and a striker (not shown) may be used to bond (e.g., fusion bond) the wafer 312 to the dummy wafer 312 (initially without distortion to the dummy wafer 311). The deformation by the striker imparts distortion indicated by arrows 352 into the wafer 312 (e.g., a 100 nm stretch). The length of the arrows 352 is proportional to a magnitude of the current distortion, and the arrows 352 are outward facing to indicate distortion from stretching.

In operation (b), the plural wafer arrangement is allowed to relax, which imparts distortion in the first wafer 311 (again, here and throughout this diagram proportion is indicated by arrow length). The distortion in the second wafer 312 is reduced by a corresponding amount, as indicated by arrows 362. In embodiments in which the stretch to the second wafer 312 is 100 nm, relaxation may provide −50 and +50 nm distortion in wafer 311 and wafer 312, respectively.

In operation (c), a wafer 313 is brought into close proximity to the other side of wafer 312, and a striker (not shown) may be used to bond (e.g., fusion bond) the wafer 313 to the wafer 312. The deformation by the striker imparts distortion 373 into the wafer 313 (the −50 nm distortion as indicated by arrows 361).

In operation (d), the plural wafer arrangement is allowed to relax, which imparts opposite distortion into the second wafer 312. As indicated by arrows 382, the opposite distortion reduces distortion already present in the wafer 312 from bonding to the dummy wafer 311 (and distortion in the wafer 313 is correspondingly reduced as indicated by arrows 383). Distortion in the dummy wafer 311 may increase during the relaxation, as indicated by arrows 381.

In operation (e), wafers 311 and 313 may be ground. For instance, dummy wafer 311 may be ground off completely (which may leave a grinding artifact on the smooth surface of wafer 312). Wafer 313 may be thinned to a target thickness (e.g., similar to a silicon-on-insulator wafer configuration, also a passivation layer (not shown) may exist on one or both of the wafers 312 and 313). Wafer 313 may be partially ground off in some embodiments, as indicated by thin remainder 315, which may be referred to as a "wafer of interest"—to be used for a device layer.

The thin remainder 315 may no longer resist the distortion in the wafer 312, which may cause the wafer 312 to relax (eliminating distortion as indicated by no arrows in wafer 312). This may change (e.g., increase) distortion in the thin remainder 315. However, as the magnitude of the distortion indicated by arrows 382 is relatively small due to use of the dummy wafer 311, total distortion in the thin remainder 315 as indicated by arrows 393 may be significantly less than total distortion without using of a dummy layer (for instance, arrows 393 are significantly shorter than arrows 352). Also, the distortion indicated by arrows 393 may correspond to stretching, which may be opposite a significantly greater magnitude distortion corresponding to compression in device layers formed based on some other bonding processes.

Simulations were performed to verify that the use of one or more dummy wafers may reduce distortion in the wafer of interest. In a pair of wafers bonded without any dummy wafer (e.g., a first wafer and a second wafer with a 100 nm stretch), an approximately 100 nm absolute value distortion has been observed in the wafer of interest following grinding. In contrast, in arrangement similar to the arrangement described in FIG. 3, even with a 100 nm stretch, only an approximately 50 nm absolute value distortion has been observed in the wafer of interest following grinding.

Figure 4:
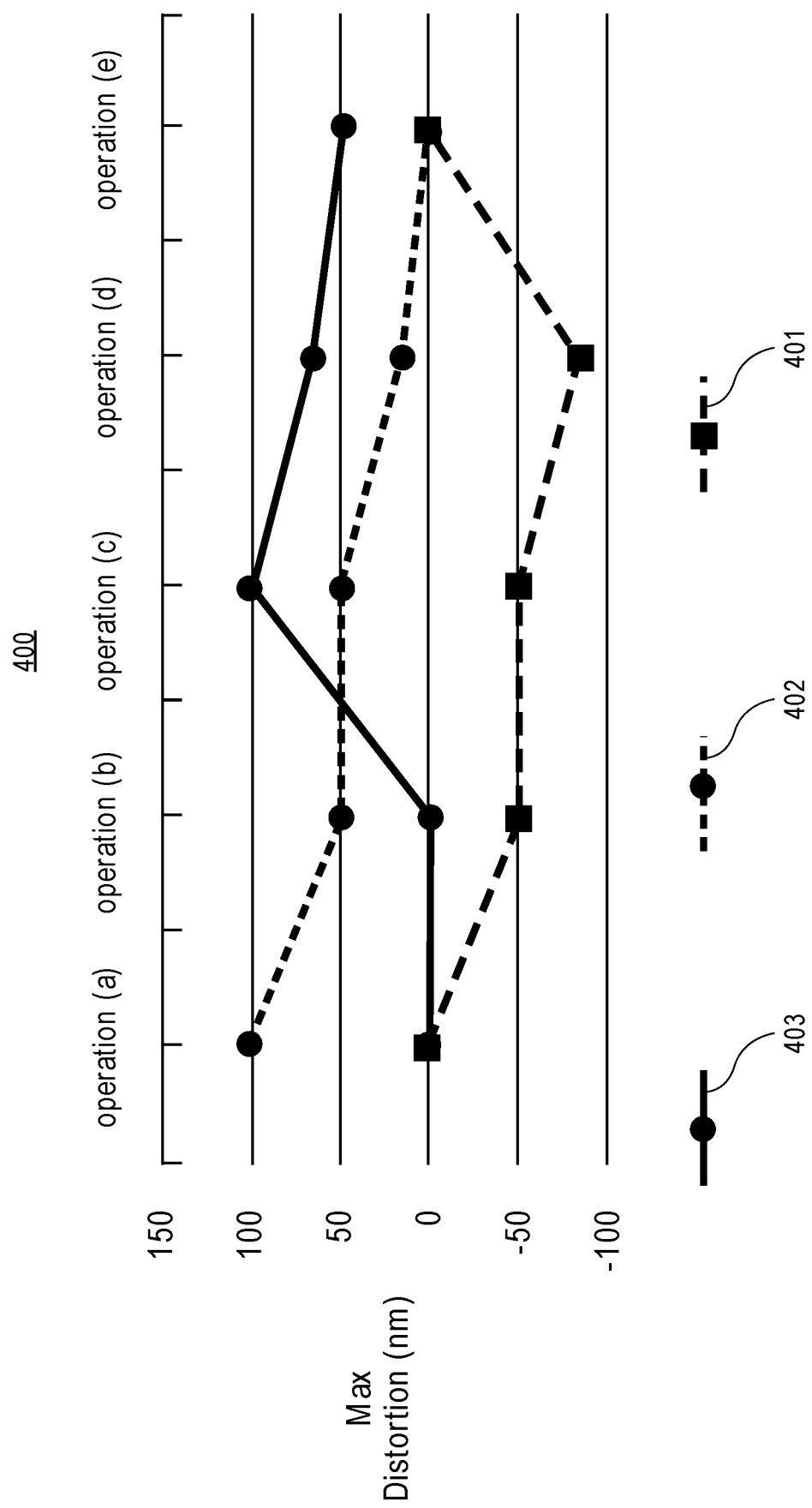
FIG. 4 is graph of max distortion per wafer during the process of FIG. 3, according to various embodiments.

FIG. 4 is graph 400 of max distortion per wafer during the process 300 of FIG. 3, according to various embodiments. The lines 401, 402, and 403 indicate distortion for wafers 311, 312, and 313 (FIG. 3), respectively. In operation (a), an approximately 100 nm distortion may be observed in wafer 312 as indicated by line 402. In operation (b), approximately 50 nm and −50 nm distortions may be observed in wafer 312 and dummy wafer 311, respectively (as indicated by lines 402 and 401, respectively). In operation (c), approximate distortions of 100 nm, 50 nm, and −50 nm may be observed in wafers 313, 312, and 311, respectively. In operation (d), approximate distortions of 66.6 nm, 33.3 nm, and −83.6 nm may be observed in wafers 313, 312, and 311, respectively. In operation (e), the thin wafer remainder 315 may include a 50 nm distortion signature.

Figure 5:
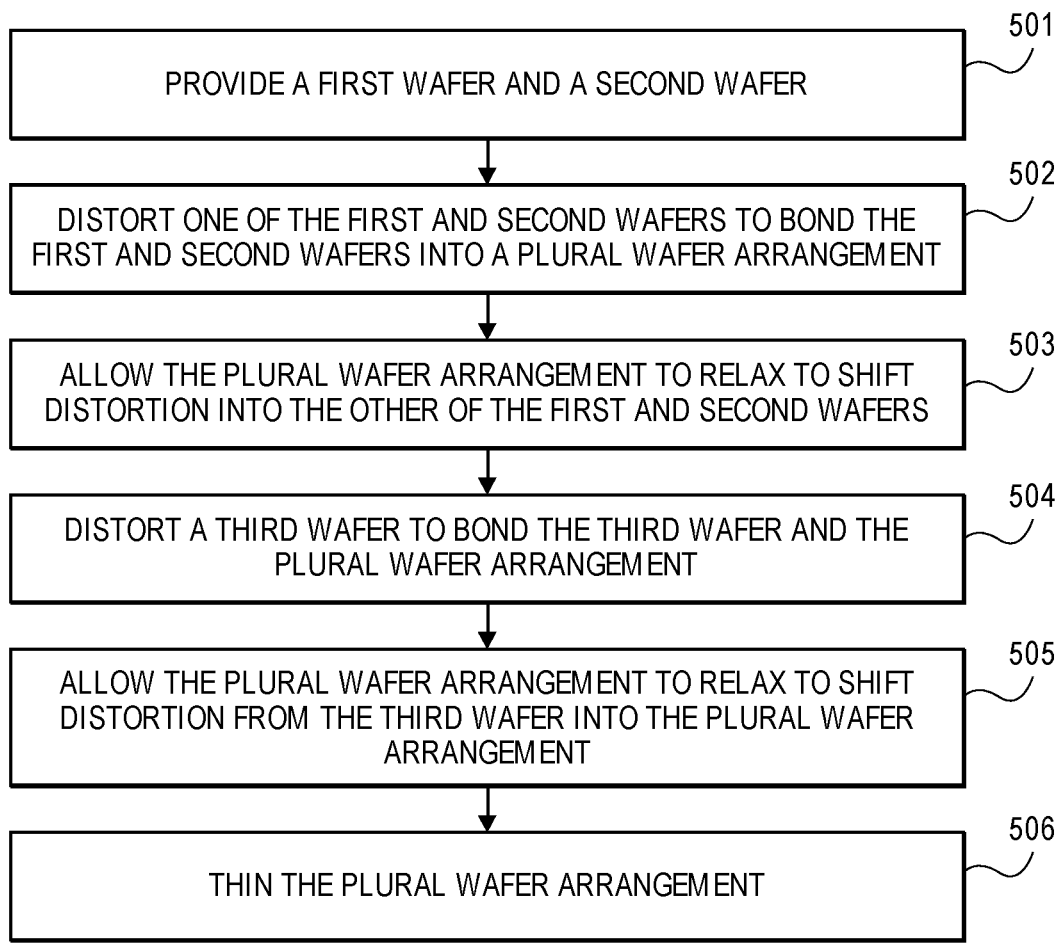
FIG. 5 is a flow chart of a process for reducing in-plane distortion (from wafer to wafer bonding) using a dummy wafer, according to various embodiments.

FIG. 5 is a flow chart of a process 500 for reducing in-plane distortion (from wafer to wafer bonding) using a dummy wafer, according to various embodiments. In block 501, a first wafer and a second wafer may be provided. The first wafer may include one or more dummy wafers.

In block 502, one of the first and second wafers may be distorted (e.g., stretched by a striker) to bond the first and second wafers to provide a plural wafer arrangement. For example, the second wafer may be stretched, in some embodiments.

In block 503, the plural wafer arrangement may be allowed to relax to shift distortion into the other of the first and second wafers. For example, distortion may shift from the second wafer into one or more dummy wafers, in some embodiments.

In block 504, a third wafer may be distorted (e.g., stretched) to bond the third wafer and the plural wafer arrangement. In block 505, the plural wafer arrangement may be allowed to relax to shift distortion from the third wafer into the plural wafer arrangement. This may include shifting distortion into a wafer that already includes distortion. For instance, the second wafer may have a distortion opposite a distortion of the one or more dummy wafers, and distortion shifting in block 505 may reduce the distortion already present in the second wafer.

In block 506, the plural wafer arrangement may be thinned. In some embodiments, each of the dummy wafers may be removed (partially or completely). In some embodiments, the third wafer may be thinned to form a device layer. This may relieve the second wafer of its distortion, which may be received by the device layer. However, an absolute value of the received distortion may be less than an absolute value of a greatest distortion present in the second wafer during process 500. In other embodiments, the device layer may have existed prior to bonding, e.g., the third wafer may be fully removed to expose the device layers.

In any of the embodiments discussed herein, one or more active layers may be on a device layer on a wafer. Some or all of the active layers may be formed following bonding, or some or all of the active layers may be formed prior to bonding (e.g., present on a device layer that is present on a wafer prior to bonding).

Figure 6:
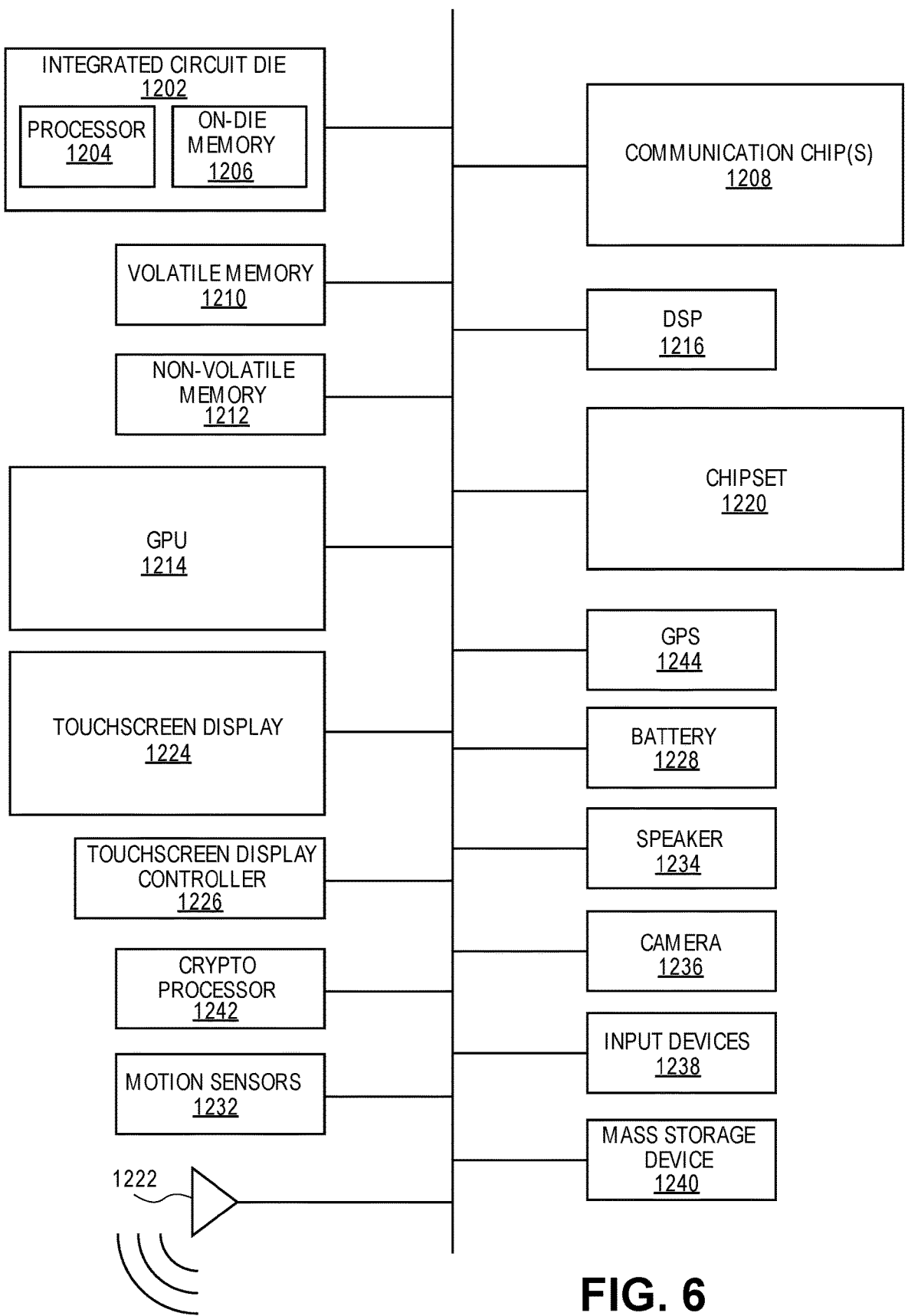
FIG. 6 is an illustration of a computing device built in accordance with an embodiment of the present disclosure.

FIG. 6 illustrates a computing device 1200 in accordance with various embodiments of the present disclosure. The computing device 1200 may include a number of components. In one embodiment, these components are attached to one or more motherboards. In an alternate embodiment, some or all of these components are fabricated onto a substrate, such as a device layer with reduced in-plane distortion from wafer to wafer bonding based on the use of one or more dummy wafers. In some embodiments, any of the components may be formed on apparatus 100 described with reference to FIG. 1 or any other embodiment of an apparatus with reduced in-plane distortion described herein. The components in the computing device 1200 include, but are not limited to, an integrated circuit die 1202 and at least one communications logic unit 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a CPU 1204 as well as on-die memory 1206, often used as cache memory, that can be provided by technologies such as embedded DRAM (eDRAM), SRAM, or spin-transfer torque memory (STT-MRAM).

Computing device 1200 may include other components that may or may not be physically and electrically coupled to the substrate. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen controller 1226, a battery 1228 or other power source, a power amplifier (not shown), a voltage regulator (not shown), a global positioning system (GPS) device 1228, a compass 1230, a motion coprocessor or sensors 1232 (that may include an accelerometer, a gyroscope, and a compass), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1200 may include a plurality of communications logic units 1208. For instance, a first communications logic unit 1208 may be dedicated to shorter range wireless communications such as Wi-Fi, NFC, and Bluetooth and a second communications logic unit 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors or metal interconnects, which may be formed on any substrate described herein. In some embodiments, the processor 1204 may include one or more layers formed on the device layer 33 of FIG. 1. The term "processor" may refer to any device or portion of a device that processes electronic data from registers and/or memory to transform that electronic data into other electronic data that may be stored in registers and/or memory.

The communications logic unit 1208 may also include one or more devices, such as transistors or metal interconnects, that are formed in accordance with embodiments described herein. In some embodiments, the communications logic unit 1208 may include one or more layers formed on the device layer 33 of FIG. 1.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

Example 1 is an apparatus formed using a dummy wafer, the apparatus comprising: a device layer fusion bonded to a first side of a carrier wafer, wherein the dummy wafer comprises a first wafer and the carrier wafer comprises a second wafer that is different than the first wafer; wherein the device layer comprise a portion of a third wafer that is different than the second wafer; and wherein a second opposite side of the carrier wafer includes: a removal process artifact, wherein a distortion signature present in the portion of the second wafer is indicative of the use of the dummy wafer fusion bonded to the second side of the carrier wafer at a location associated with the removal process artifact, or a remainder of the dummy wafer.

Example 2 may include the subject matter of example 1 and/or any other example herein, wherein the apparatus comprises a silicon on insulator (SOI) device.

Example 3 may include the subject matter of any of examples 1-2 and/or any other example herein, wherein the removal process artifact comprises a ground surface of the second side of the carrier wafer.

Example 4 may include the subject matter of any of examples 1-3 and/or any other example herein, Example 5 may include the subject matter of any of examples 1-4 and/or any other example herein, Example 6 is a method of forming a device layer using a dummy wafer, comprising: distorting one of first and second wafers to bond the first and second wafers into a plural wafer arrangement; allowing the plural wafer arrangement to relax to shift distortion into the other of the first and second wafers; distorting a third wafer to bond the third wafer and the plural wafer arrangement; following distorting the third wafer, allowing the plural wafer arrangement to relax to shift distortion from the third wafer into the plural wafer arrangement; and removing at least a portion of the first wafer from the plural wafer arrangement, wherein the first wafer comprises the dummy wafer.

Example 7 may include the subject matter of example 6 and/or any other example herein, further comprising removing some of the third wafer from the plural wafer arrangement to form a device layer from a remainder of the third wafer Example 8 may include the subject matter of any of examples 6-7 and/or any other example herein, wherein the second wafer comprises a carrier wafer.

Example 9 may include the subject matter of any of examples 6-8 and/or any other example herein, wherein removing the at least the portion of the first wafer from the plural wafer arrangement further comprises grinding off the first wafer.

Example 10 may include the subject matter of any of examples 6-9 and/or any other example herein, wherein following the grinding the plural wafer arrangement includes forming a removal process artifact on the second wafer.

Example 11 is a system, comprising: a processor; at least one of a network device, a display, or a memory coupled to the processor; wherein the processor comprises an integrated circuit, the integrated circuit including: a device layer fusion bonded to a first side of a carrier wafer, wherein the dummy wafer comprises a first wafer and the carrier wafer comprises a second wafer that is different than the first wafer; wherein the device layer comprise a portion of a third wafer that is different than the second wafer; and wherein a second opposite side of the carrier wafer includes: a removal process artifact, wherein a distortion signature present in the portion of the second wafer is indicative of the use of the dummy wafer fusion bonded to the second side of the carrier wafer at a location associated with the removal process artifact, or a remainder of the dummy wafer; and one or more active layers formed on the device layer.

Example 12 may include the subject matter of example 11 and/or any other example herein, wherein the apparatus comprises a silicon on insulator (SOI) device.

Example 13 may include the subject matter of any of examples 11-12 and/or any other example herein, wherein the removal process artifact comprises a ground surface of the second side of the carrier wafer.

Example 14 may include the subject matter of any of examples 11-13 and/or any other example herein, wherein the first side of the carrier wafer comprises a buried oxide (BOX) layer.

Example 15 may include the subject matter of any of examples 11-14 and/or any other example herein, wherein the first side of the carrier wafer comprises an a passivation layer.

Example 16 is an apparatus comprising: a dummy wafer fusion bonded to a first side of a carrier wafer, wherein the dummy wafer comprises a first wafer and the carrier wafer comprises a second wafer that is different than the first wafer; and a third wafer fusion bonded to a second opposite side of the carrier wafer; wherein the third wafer includes a distortion signature that is different than a distortion signature included in the first wafer.

Example 17 may include the subject matter of example 16 and/or any other example herein, wherein a magnitude of the distortion signature of the first wafer is greater than a magnitude of the distortion signature of the third wafer.

Example 18 may include the subject matter of any of examples 16-17 and/or any other example herein, wherein one of the distortion signatures comprises a compression artifact and the other of the distortion signatures comprises a stretch artifact.

Example 19 may include the subject matter of any of examples 16-18 and/or any other example herein, wherein the first side of the carrier wafer comprises a passivation layer.

Example 20 may include the subject matter of any of examples 16-19 and/or any other example herein, wherein the second side of the carrier wafer comprises a passivation layer.

The above description of illustrated implementations of various embodiments, including what is described in the Abstract, is not intended to be exhaustive or to limit the present disclosure to the precise forms disclosed. While specific implementations of, and examples for, various embodiments are described herein for illustrative purposes, various equivalent modifications are possible within the scope of the present disclosure, as those skilled in the relevant art will recognize.

What is claimed is:

1. An apparatus comprising:
  a dummy wafer fusion bonded to a first side of a carrier wafer, wherein the dummy wafer comprises a first wafer and the carrier wafer comprises a second wafer that is different than the first wafer; and
  a third wafer fusion bonded to a second opposite side of the carrier wafer;
  wherein the third wafer includes a distortion signature that is different than a distortion signature included in the first wafer.

2. The apparatus of claim 1, wherein a magnitude of the distortion signature of the first wafer is greater than a magnitude of the distortion signature of the third wafer.

3. The apparatus of claim 1, wherein one of the distortion signatures comprises a compression artifact and the other of the distortion signatures comprises a stretch artifact.

4. The apparatus of claim 1, wherein the first side of the carrier wafer comprises a passivation layer.

5. The apparatus of claim 1, wherein the second side of the carrier wafer comprises a passivation layer.

6. An apparatus comprising:
  a first carrier wafer having a first side and a second side that is opposite the first side;
  at least part of a second wafer fusion bonded to the second side of the first carrier wafer; and
  a remainder of a third dummy wafer fusion bonded to the first side of the first carrier wafer, or a removal process artifact on the first side of the first carrier wafer, wherein a distortion signature present in the first carrier wafer is indicative of the use of the third dummy wafer fusion bonded to the first side of the first carrier wafer at a location associated with the removal process artifact.

7. The apparatus of claim 6, wherein the apparatus comprises a silicon on insulator (SOI) device.

8. The apparatus of claim 6, wherein the removal process artifact comprises a ground surface of the first side of the first carrier wafer.

9. The apparatus of claim 6, wherein the second side of the carrier wafer comprises a buried oxide (BOX) layer.

10. The apparatus of claim 6, wherein the second side of the carrier wafer comprises a passivation layer.

11. A system, comprising:
  a processor;
  at least one of a network device, a display, or a memory coupled to the processor, wherein the processor comprises an integrated circuit, the integrated circuit including:
    a first carrier wafer having a first side and a second side that is opposite the first side;
    at least part of a second wafer fusion bonded to the second side of the first carrier wafer; and
    a remainder of a third dummy wafer fusion bonded to the first side of the first carrier wafer, or a removal process artifact on the first side of the first carrier wafer, wherein a distortion signature present in the first carrier wafer is indicative of the use of the third dummy wafer fusion bonded to the first side of the first carrier wafer at a location associated with the removal process artifact.

12. The system of claim 11, wherein the integrated circuit comprises a silicon on insulator (SOI) device.

13. The system of claim 11, wherein the removal process artifact comprises a ground surface of the first side of the first carrier wafer.

14. The system of claim 11, wherein the second side of the carrier wafer comprises a buried oxide (BOX) layer.

15. The system of claim 11, wherein the second side of the carrier wafer comprises a passivation layer.

* * * * *